US007068231B2

(12) United States Patent
Huang

(10) Patent No.: US 7,068,231 B2
(45) Date of Patent: Jun. 27, 2006

(54) WIDE-BAND TAPERED-SLOT ANTENNA FOR RF TESTING

(75) Inventor: Yizhou Huang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/106,148

(22) Filed: Apr. 14, 2005

(65) Prior Publication Data

US 2005/0174293 A1 Aug. 11, 2005

Related U.S. Application Data

(63) Continuation of application No. 10/014,036, filed on Dec. 10, 2001, now Pat. No. 6,900,771.

(60) Provisional application No. 60/256,144, filed on Dec. 15, 2000.

(51) Int. Cl.
*G01R 29/08* (2006.01)

(52) U.S. Cl. .................... 343/703; 343/767; 455/67.11

(58) Field of Classification Search ................ 343/703, 343/767

See application file for complete search history.

(56) References Cited

U.S. PATENT DOCUMENTS 4,968,983 A * 11/1990 Maeda ........................ 343/703
5,001,494 A * 3/1991 Dorman et al. ............. 343/703
6,181,285 B1 * 1/2001 Sullivan et al. ............... 33/703
6,229,490 B1 * 5/2001 Hofmann ..................... 343/702
6,839,032 B1 * 1/2005 Teshirogi et al. ........... 343/702

* cited by examiner

*Primary Examiner*—Tho Phan
(74) *Attorney, Agent, or Firm*—McAndrews, Held & Malloy, Ltd.

(57) ABSTRACT

Methods and apparatus for testing wireless devices. Devices being tested receive and transmit radio frequency test signals. These radio frequency test signals are received or transmitted using an antenna associated with the device, and then are transmitted or received using a unique wide-band tapered-slot antenna connected to a test system. The wide-band tapered-slot antenna has an input path that is substantially orthogonal to the tapered slot, and one of the conductors defining the slot is grounded.

7 Claims, 9 Drawing Sheets

1000

| | FREQUENCY BAND | AVERAGE S21 PREVIOUS | AVERAGE S21 TSA | VARIATION IN S21 PREVIOUS | VARIATION IN S21 TSA |
|---|---|---|---|---|---|
| 1010 | GSM | -18.97 | -15.8 | 4.32 | 0.45 |
| 1020 | DCS | -15.26 | -16.0 | 0.92 | 0.24 |
| 1030 | PCS | -14.31 | -12.3 | 1.47 | 0.26 |
| | 1040 | 1050 | 1060 | 1070 | 1080 |

FIGURE 10

WIDE-BAND TAPERED-SLOT ANTENNA FOR RF TESTING

CROSS-REFERENCES TO RELATED APPLICATIONS

This application is a continuation of U.S. application Ser. No. 10/014,036 filed Dec. 10, 2001 now U.S. Pat. No. 6,900,771, which in turn claims the benefit of Provisional Application Ser. No. 60/256,144 filed Dec. 15, 2000, which are both incorporated herein by reference.

BACKGROUND OF THE INVENTION

The present invention relates generally to testing electronic products, and more particularly to a wide-band tapered-slot antenna and its use in testing wireless radio frequency (RF) devices.

The electronics marketplace is experiencing tremendous growth in the wireless area. Mobile phones, once a luxury referred to as “car phones,” are now ubiquitous. Wireless PDAs, laptops, routers, switches, hubs, and network interface cards are popular.

Like most products, these are tested to ensure that when a consumer makes a purchase, the unit works properly. The goal of testing is to ship every “good” unit, and reject every “bad” unit manufactured. The percentage of good units is the yield. A bad unit may be nonfunctioning, or may not perform as well as its designers intend. Each bad unit shipped costs the manufacturer in terms of customer satisfaction, brand loyalty, and goodwill. Each good unit not shipped may mean that it is retested or replaced, or that a sale is lost.

An example of a wireless product that is tested is mobile phones. In some test systems, a phone is placed in a test box, connected to a test system using a system connector and back plug cable, and various parameters are measured. Based on these measurements, the phone is rejected as bad or passed as good. Unfortunately, in a manufacturing environment, there are variations in readings from one box, as well as among boxes. These variations reduce yield and lower quality control. Also, the back plug cable connectors tend to wear out, and require replacing.

Moreover, each phone requires its own fixture, such that when a different phone is to be tested, the test boxes must be swapped. The new boxes then need to be calibrated. The time needed to install and adjust the new boxes adds to a phone’s cost.

Thus, it is desirable to have methods and apparatus for testing wireless devices that reduce variations in measurements, eliminate the need to change test boxes, and eliminate the need for a back plug.

SUMMARY OF THE INVENTION

Accordingly, the present invention provides methods and apparatus for testing wireless devices, A new asymmetric wide-band tapered-slot antenna with a new feed port has been developed. In one embodiment of the present invention, this tapered-slot antenna is used in a test box for testing phones. Using this antenna, test measurement variations are reduced. In particular, in a specific embodiment the variation in insertion loss among test boxes is reduced by a factor of ten.

A test box having this tapered-slot antenna can be used in testing many types of devices, for example, different types of phones. This eliminates the need for costly and time consuming changes to a production line when new or different models are being tested. Also, a back plug cable, which is used instead of a test antenna in some test systems, is not required. This means that a back plug cable does not have to be connected to each phone being tested, and it does not have to be replaced when it wears out.

An exemplary embodiment of the present invention provides an apparatus for testing wireless devices. The apparatus includes a radio frequency transmitter, a tapered-slot antenna coupled to the radio frequency transmitter, and a bottom surface for supporting a device under test.

In further embodiments, the apparatus includes a conductive shield substantially surrounding the tapered-slot antenna, the bottom surface, and the device under test.

Another exemplary embodiment provides a method of testing an RF receiver. The method includes setting an output power level in a transmitter, generating a radio frequency test signal with the transmitter, and applying the radio frequency test signal to a tapered-slot antenna. The radio frequency test signal is transmitted using the tapered-slot antenna, and received with a second antenna. The radio frequency test signal on the second antenna is received with a receiver. The tapered-slot antenna may be a wide-band asymmetric tapered-slot antenna.

Yet a further exemplary embodiment of the present invention provides a method of testing a wireless transmitter. The method provides generating a radio frequency test signal with the transmitter, and applying the radio frequency test signal to a first antenna. The radio frequency test signal is transmitted using the first antenna, and received with a tapered-slot antenna. The radio frequency test signal on the tapered-slot antenna is received with a receiver. Again, the tapered-slot antenna may be a wide-band asymmetric tapered-slot antenna.

A further exemplary embodiment provides a tapered-slot antenna. The antenna includes a first substrate, a first metal piece on the first substrate, the first metal piece having a first edge, and a second metal piece on the first substrate, the second metal piece having a second edge. The second edge faces the first edge. The first metal piece is grounded, and in a specific embodiment, the first and second edges are defined by a Bessel function.

Another exemplary embodiment also provides a tapered-slot antenna. This antenna includes a first substrate, a first metal piece on the first substrate, the first metal piece having a first edge, and a second metal piece on the first substrate, the second metal piece having a second edge. The second edge faces the first edge. A strip line is also included, the strip line substantially orthogonal to the first and second edges. In a specific embodiment, the first and second edges are defined by a Bessel function.

A better understanding of the nature and advantages of the present invention may be gained with reference to the following detailed description and the accompanying drawings.

BRIEF DESCRIPTION OF THE DRAWINGS

FIG. 10 is a table of measured results of the insertion loss and variations in the insertion loss for three different signal bands using test boxes consistent with an embodiment of the present invention;

DESCRIPTION OF SPECIFIC EMBODIMENTS

Figure 1:
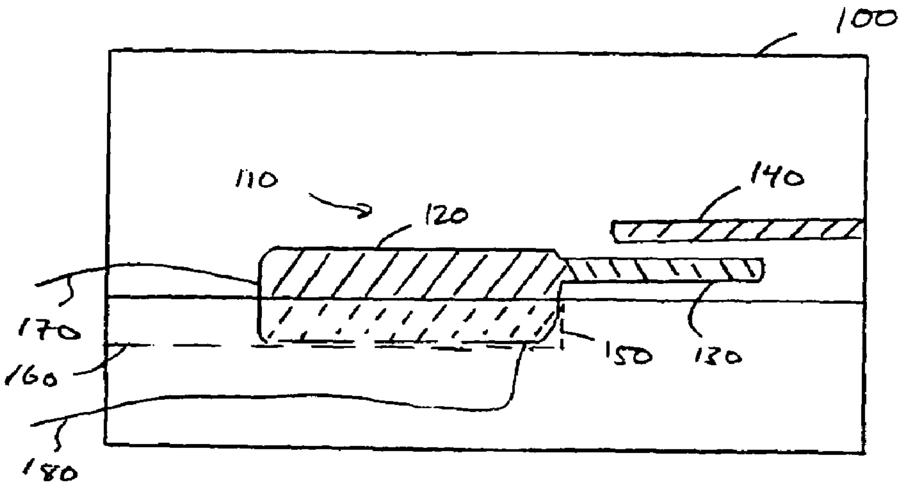
Figure 1 (PRIOR ART)
FIG. 1 illustrates a wireless phone in a conventional test box.

FIG. 1 illustrates a wireless phone 110 in a conventional test box 100. This figure, as with all the included figures, is shown for illustrative purposes only, and does not limit either the possible applications of embodiments of the present invention, or the claims, The wireless phone 110 has a body 120 and antenna 130. The phone rests on support surface 160 against stop 150, such that antenna 130 is approximately aligned to test antenna 140. The phone is connected to a test system (not shown) by system connector 170. The system connector 170 typically plugs into the bottom of the phone. A back plug cable 180 may also connect the phone to the test system. The back plug is an RF connector on the phone's PCB, usually near the antenna, and the back plug cable 180 connects to the phone at the back plug.

If the back plug is used, testing is simplified since there is no need to align the phone antenna 130 to a test antenna 140—test signals are sent and received using the back plug cable 180 instead of the test antenna 140. But the system connector 170 and back plug cable 180 wear out after being connected and disconnected to several phones, and must be replaced. This is expensive since while the actual connector is being replaced, the test box is temporarily out of service. Also, a technician is needed to make the repairs.

Test box 100 may be shielded to protect antennas 140 and 130 from stray RF signals such as those from local broadcast stations, power distribution networks, electrical equipment, and the like. A shield may be a sheet or grid of metal, such as copper or other conductors, enclosing the test box. The shield is typically grounded or connected to another low impedance source.

Test signals are not sent through contact, but through the air. The test antenna 140 couples the RF signal between the phone under test and the RF test station. This coupling, and its consistency, are critical to wireless device testing. Variations and unpredictability can result in rejecting good and passing nonfunctional or substandard devices.

Each RF test station may control more than one test box, for example there may be four test boxes per RF test station.

Typically, a phone's receiver and transmitter are tested. When testing the phone's receiver, signals are applied to test antenna 140 and are received by the wireless phone on antenna 130. When testing the phone's transmitter, signals are generated by the wireless phone 110, applied to the antenna 130, and received by the test antenna 140. Tests performed may include functionality, receive sensitivity, transmit output power, and other tests.

Figure 2:
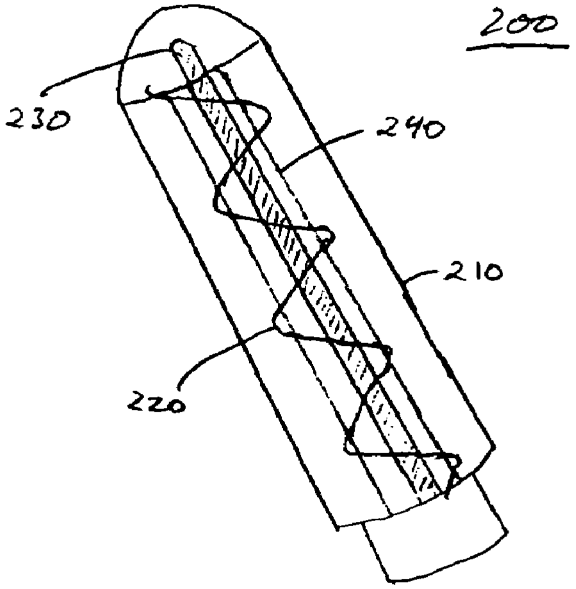
Figure 2 (PRIOR ART)
FIG. 2 illustrates a conventional antenna that may be used with a dual band wireless phone.

FIG. 2 illustrates a conventional antenna that may be used with a dual band wireless phone. In a specific example, the antenna is encapsulated in a plastic body 210. A helical coil antenna 220 is used to send and receive global system for mobile (GSM) signals, and a dipole antenna 230 is used to send and receive digital communications services (DCS) signals. An insulator 240 may be used to separate the helical antenna 240 from the dipole antenna 230.

Figure 3:
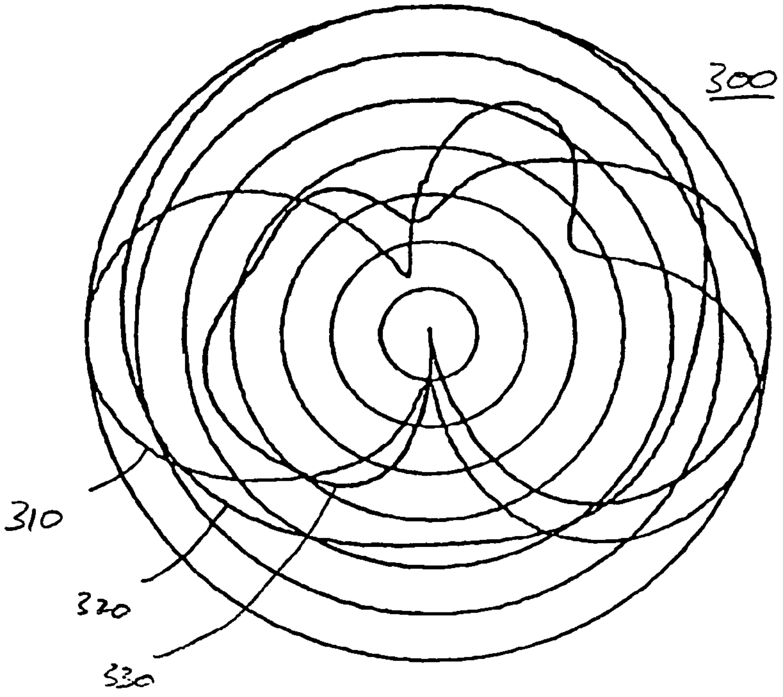
Figure 3 (PRIOR ART)
FIG. 3 illustrates the strength of an electromagnetic field surrounding a conventional antenna when a GSM signal is being transmitted.

FIG. 3 illustrates the strength of an electromagnetic (EM) field surrounding a conventional antenna, such as that shown in FIG. 2, when a GSM signal is being transmitted. These are computer simulation results that were verified with measurement data. The EM field is viewed along a center or axial line of the antenna, that is, along the antenna or Z-axis. Each contour line 310, 320, and 330 corresponds to a specific angular of the EM field when the antenna is transmitting. As can be seen, the distance from the antenna at which a particular transmit power is measured depends on the angular position at which the measurement is made. That is, the radiation field for this antenna is not symmetric. Contour line 310 corresponds to measurements taken with $\phi$ (phi) equal to 90 degrees and $\theta$ (theta) swept from 0 to 360 degrees, contour line 320 corresponds to measurements taken with $\phi$ swept from 0 to 360 degrees and $\theta$ equal to 90 degrees, and contour line 330 corresponds to measurements taken with $\phi$ equal to 0 degrees and $\theta$ swept from 0 to 360 degrees.

Figure 4:
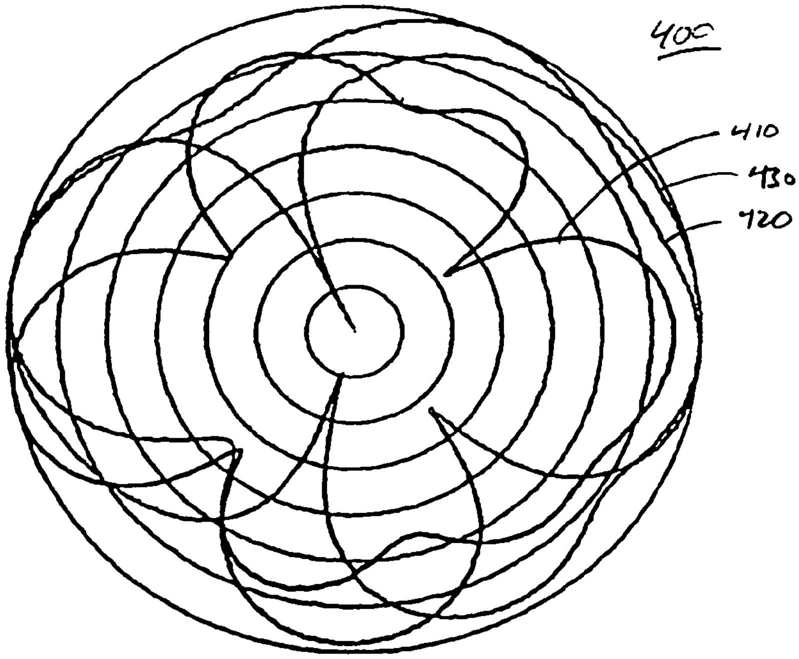
Figure 4 (PRIOR ART)
FIG. 4 illustrates the intensity of an electromagnetic field surrounding a conventional antenna when signals consistent with the DCS band are transmitted.

FIG. 4 similarly illustrates the intensity of the EM field surrounding a conventional antenna when signals consistent with the DCS band are transmitted. Specifically, contours 410, 420, and 430 illustrate the angular distribution of the EM field at which a certain transmit power level is measured at the same distance. As before, these are computer simulation results that were verified with measurement data. Contour line 410 corresponds to measurements taken with $\phi$ equal to 0 degrees and $\theta$ swept from 0 to 360 degrees, contour line 420 corresponds to measurements taken with $\phi$ swept from 0 to 360 degrees and $\theta$ equal to 90 degrees, and contour line 430 corresponds to measurements taken with $\phi$ equal to 90 degrees and $\theta$ swept from 0 to 360 degrees.

In the manufacturing process, each plastic encapsulated antenna looks like the other plastic encapsulated antennas. But when these antennas are screwed in or otherwise attached to their respective phones, the angular position of each is likely to vary. This means that when the completed phone is tested in a test box 100, the measured power from the antenna 130 and the received power at antenna 140 are functions of the angular position of each antenna.

The result is that two phones, otherwise identical, appear to transmit differing amounts of power. Moreover, the test antenna 140 in each different test box 100 has a different angle or displacement. Thus, an individual phone 110 appears to have a different receive sensitivity in each test box. In a specific production line, a phone may fail in one test box, but pass in another. The practical implication is that each box needs to be calibrated for each model of phone, and must be replaced or recalibrated when a new model is tested. Also, since the testing has these inherent inaccuracies, they must be accounted for when setting test limits. This is known as guard-banding. The result is that some good phones require retesting or are rejected. This increases the unit cost per phone.

Figure 5A:
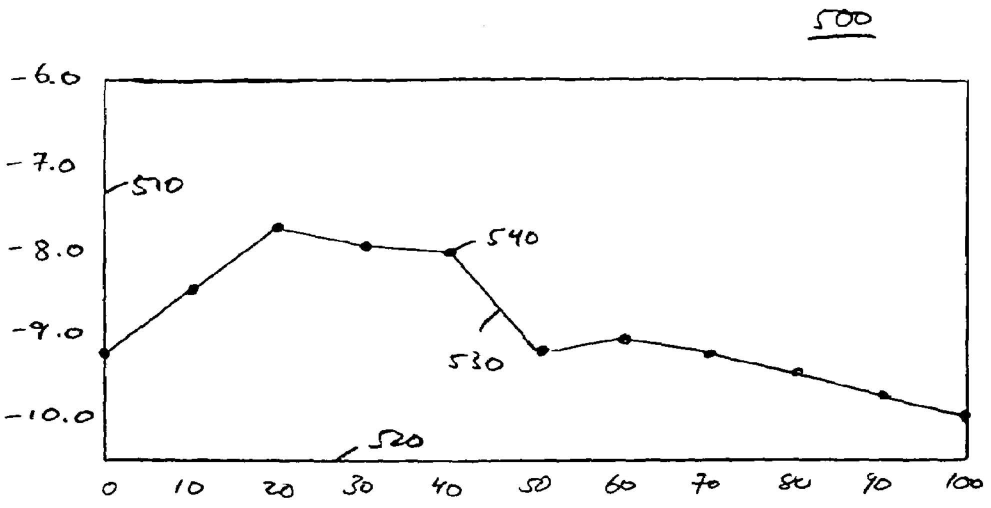
FIGURE 5A (PRIOR ART)
FIGS. 5A and 5B illustrate an insertion loss as a function of angular displacement of a conventional antenna in a test system.
Figure 5B:
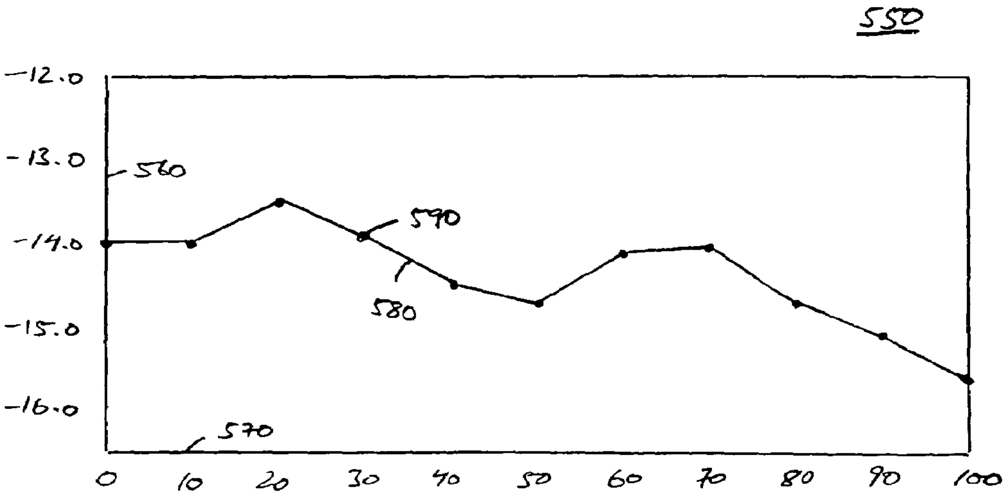
FIGURE 5B (PRIOR ART)

FIGS. 5A and 5B illustrate the insertion loss, or RF coupling constant (S21) as a function of angular displacement or rotation of a conventional phone antenna in a conventional test system where the test antenna 140 and phone antenna 130 are similar to a dual band antenna such as antenna 200 shown in FIG. 2. To generate FIG. 5A, a GSM signal is sent by the phone antenna 130 and received by the test antenna 140. The insertion loss is measured. The phone antenna 130 is rotated, and the insertion loss is measured again. Data 540 are plotted as waveform 530 along an X-axis 520 corresponding to rotation and a Y-axis 510 corresponding to the insertion loss in dB. The insertion loss varies more than two dB for a 100 degree rotation.

Similar measurements were made with the phone antenna 130 moving relative to, but aligned with, the test antenna 140. No appreciable change in the insertion loss was seen when the phone antenna was moved approximately 1 mm, which is greater than the expected tolerance in a production test box.

FIG. 5B shows the insertion loss as a function of angular displacement or rotation of a conventional phone antenna when DCS signals are sent. To generate this curve, a DCS signal is sent by the phone antenna 130 and received by the test antenna 140. The insertion loss is measured. The phone antenna 130 is rotated, and the insertion loss is measured again. Measured data points 590 are plotted to generate curve 580. The curve is plotted against an X-axis 570 of angular displacement and a Y-axis 560 in dB. As can be seen, in the DCS band, angular displacement results in a change in insertion loss of more than two dB.

This variation is worse in a production environment. Not only can the antenna on the phone rotate relative to the test antenna, but the test antennas in different test boxes can rotate relative to each other. To reduce this variation, one embodiment of the present invention uses a wide-band tapered-slot antenna in place of the test antenna 140 in test box 100. This antenna was designed to improve manufacturing line yields, as well as to reduce the change out, installation, and tuning times and costs associated with each phone model having its own test box. This wide-band tapered-slot antenna has a new configuration and new microwave-feed structure, or RF feed port, for transmitting and receiving test signals.

Figure 6A:
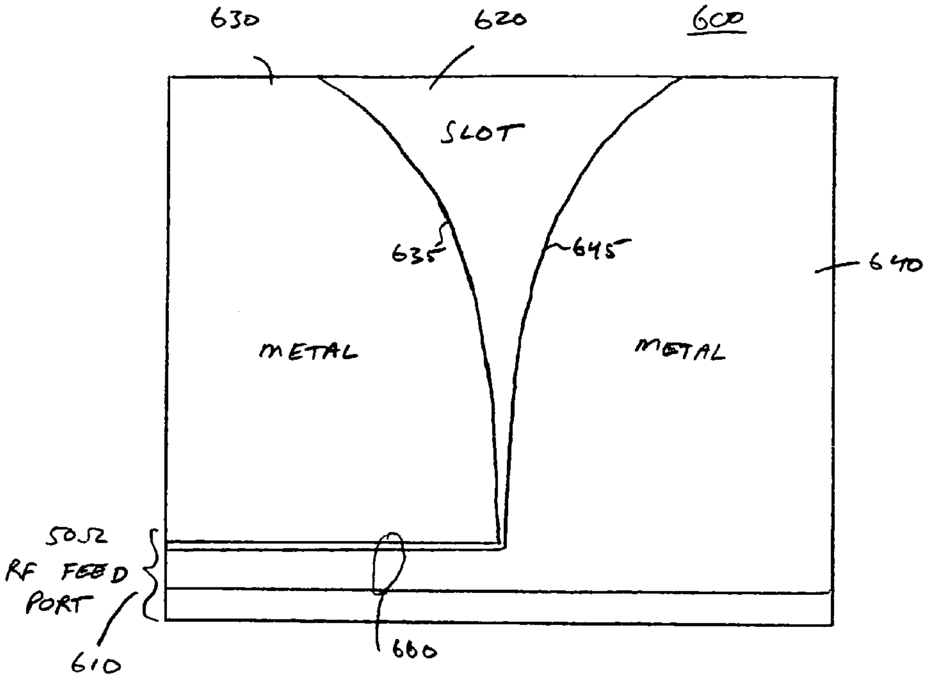
FIG. 6A shows the physical layout of a wide-band tapered-slot antenna consistent with an embodiment of the present invention.

FIG. 6A shows the physical layout of such a tapered-slot antenna 600. The tapered-slot antenna 600 includes a 50 Ohm RF signal port, and a slot 620 surrounded by a first piece of metal 630 and a second piece of metal 640. Pieces 630 and 640 are referred to as metal pieces, alternately they may be formed from any conductor or other appropriate material. A signal to be transmitted is applied at the RF signal port 610 and is transmitted at the slot 620. Alternately, the antenna receives an RF signal at the slot 620 and provides it at the RF signal port 610.

In a specific embodiment, a sub-miniature type A (SMA) connector has its center connector coupled to metal piece 640 and its shield, or ground, connected to metal piece 630. Alternately, other connectors may be used. In this embodiment, the metal piece 630 is grounded, and the received or transmitted signal appears on metal piece 640. Since the signals on each piece of metal are not equal, this antenna may be referred to as an asymmetric tapered-slot antenna. This arrangement simplifies the connections to the tapered-slot antenna.

From the SMA connector, the signal follows an asymmetric strip line 660 to the tapered-slot 620 which is formed by edges 635 and 645. The strip line 660 is substantially orthogonal to the edges 635 and 645. This strip line can have a characteristic impedance of 50 ohms, or other suitable value depending on system requirements, such as 100 or 200 ohms.

Also, in a specific embodiment, the curves of edges 635 and 645 are defined by, or follow a Bessel function. They in fact are the same Bessel function, but this is not a requirement. Alternately, the edges may be defined by Gaussian, exponential, hyperbolic, or other type functions. Edges 635 and 645 face each other, thus forming a tapered slot 620.

This new planar antenna was designed using both finite element method (FEM) and method of moment (MOM) computer simulation methods. This antenna has a low profile making it easy to implement in a test box environment. It is low cost and easily fabricated. It is suitable for conformal installation, that is, it can be increased or decreased in size without being redesigned.

Figure 6B:
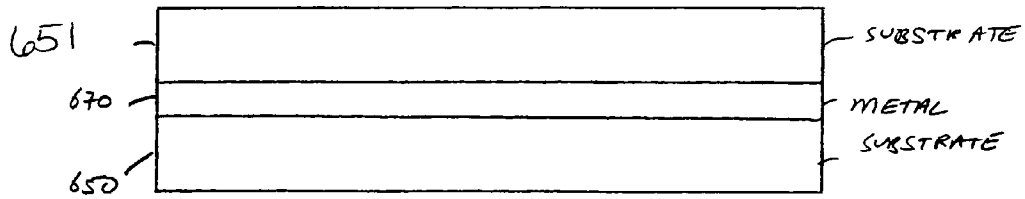
FIG. 6B shows a side view of the wide-band tapered-slot antenna.

FIG. 6B shows a side view of a tapered-slot antenna structure. A bottom substrate 650 and a top substrate 651 surround a metal layer 670 which is formed in the pattern shown in FIG. 6A. The substrate 651 may be formed of any low conductivity or nonconductive material, or other appropriate material.

Figure 7:
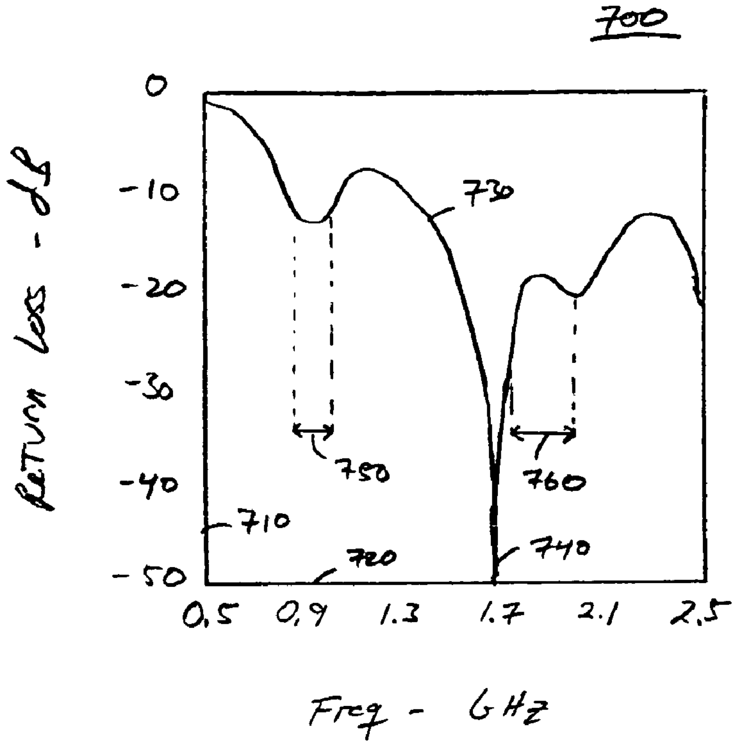
FIG. 7 shows the return loss for the wide-band tapered-slot antenna.

FIG. 7 shows the return loss for a tapered-slot antenna consistent with an embodiment of the present invention, such as the antenna of FIG. 6A. The return loss (S11) 730 is plotted along an X-axis of frequency and a Y-axis 710 that is in dB. As can be seen, near the tuned frequency of approximately 1.7 GHz the return loss is very low. Thus, at that frequency, almost all the power applied to the antenna is transmitted and very little is returned or reflected. Though the antenna is not tuned to the GSM, PCS, or DCS band specifically, the return loss in those bands is still quite good. Specifically, a low point or inflection in the return loss curve 730 is tuned to the GSM band shown here as frequency range 750. Frequency range 750 spans from 880 to 915 MHz, the GSM band. Moreover, the antenna's tuned frequency is near the PCS and DCS frequencies, shown here as range 760, so the return loss is also low in those bands. This low return loss means that as signals are transmitted by the test antenna, little power is lost in reflections. Since losses are low, the power transmitted is well controlled, leading to stability and predictability in testing.

Figure 8:
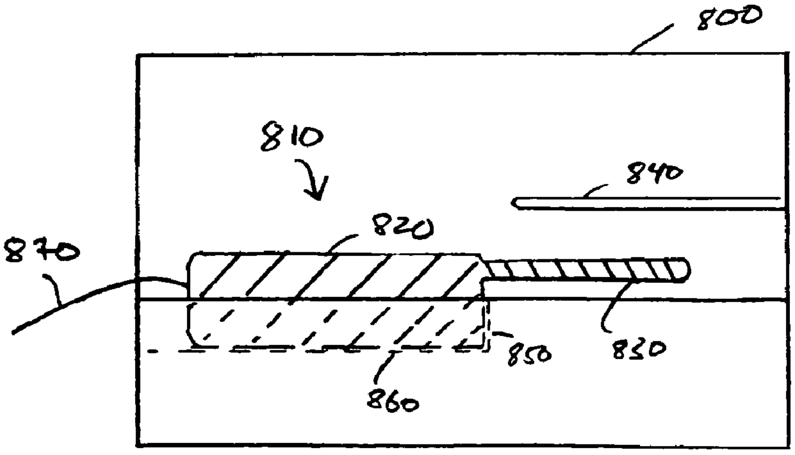
FIG. 8 illustrates a test box consistent with an embodiment of the present invention.

FIG. 8 illustrates a test box 800 consistent with an embodiment of the present invention. A phone 810 having a body 820 and an antenna 830 is tested using a tapered-slot antenna 840. The phone rests on a surface 860 against stop 850 to ensure that the antenna 830 is properly aligned to the tapered-slot antenna 840. Tapered-slot antenna 840 is shown as being on the right side of the test box. But in other embodiments, the tapered-slot antenna may be connected to another side of the test box. For example, a tapered-slot antenna may be on the left side of the test box 800. An embodiment of the present invention provides a test box which may be used for testing phones for GSM, PCS, DCS, or combinations of these standards. For example, specific embodiments are used in testing GSM and DCS phones, as well as triband phones. Phones that incorporate the upcoming WCDMA specification may also be tested. Phones and other wireless devices that are consistent with other standards may also be tested.

Figure 9A:
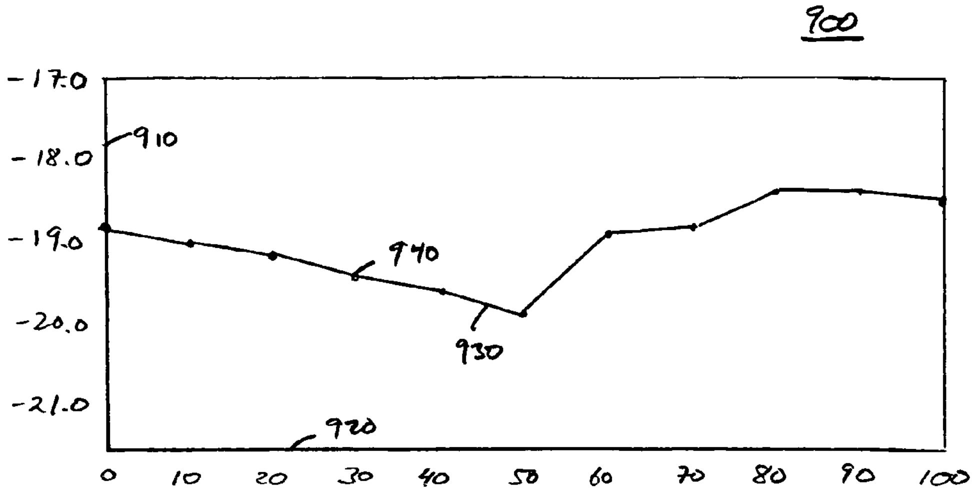
FIGS. 9A and 9B are a plots showing the insertion loss as a function of the angular displacement of an antenna in a test system consistent with an embodiment of the present invention.

A system connector 870 connects the phone 810 to the test system (not shown). But a back plug cable is no longer required, since the test tapered-slot antenna 840 is used. This means that in testing, only one connection to the phone is needed, and there is only one connector—the system connector—that wears out and needs to be replaced. This saves time in testing and test box maintenance, and saves the cost of repair and replacement of the back plug cable FIG. 9A is a plot 900 showing insertion loss as a function of the angular displacement of antenna 830 in a test system like that shown in FIG. 8. Data points 940 are plotted, generating curve 930, which is plotted against an X-axis 920 of rotation and a Y-axis 910 of dB. To generate this curve, a GSM signal is sent by phone 810 using antenna 830. The signal is received by tapered-slot antenna 840 and the insertion loss is measured. The phone antenna 830 is rotated and the measurement is taken again. As can be seen, the change in insertion loss as a function rotation is approximately 1.5 dB.

Figure 9B:
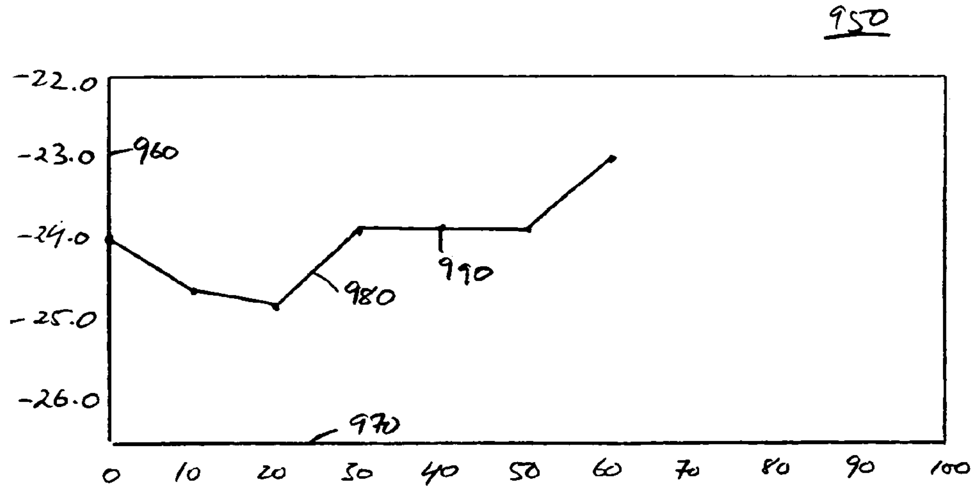

FIG. 9B is a plot 950 showing the insertion loss as a function of the angular displacement of antenna 830 in a test system like that shown in FIG. 8. Data points 990 are plotted, generating curve 980. This curve of insertion loss is plotted against an X-axis 970 of rotation and a Y-axis 960 of dB. To generate this curve, a DCS signal is sent by phone 810 using antenna 830. The signal is received by the tapered-slot antenna 840 and the insertion loss is measured. The phone antenna 830 is rotated and the measurement is retaken. As can be seen, the change in insertion loss as a function of rotation is approximately 1.8 dB.

A comparison of FIGS. 9A and 9B to FIGS. 5A and 5B shows an improvement in the change in insertion loss as a function of rotation. But now the test tapered-slot antenna 840 does not rotate in one test box as compared to a different test box. This means that the tapered-slot antenna 840 in each test box in a manufacturing line all have the same relative orientation. Thus, when a phone is tested in a first box and retested in a second box, the measurements taken in each box match.

FIG. 10 is a Table 1000 of measured results of the insertion loss and variations in the insertion loss for three different signal bands in the manufacturing line. The results for the GSM, DCS, and PCS bands are listed in rows 1010, 1020, and 1030. The average insertion loss for a conventional test system is listed in column 1050. The average insertion loss using a tapered-slot antenna as the test antenna is listed in column 1060. The variation in insertion loss of the conventional test system is listed in column 1070, and the variation in insertion loss using a tapered-slot antenna as the test antenna is listed in column 1080. The variation in insertion loss is reduced by up to a factor of 10 by using a tapered-slot antenna as the test antenna 840.

The tapered-slot antenna achieved better than expected results in a test box as compared to the test lab environment where data for FIGS. 9A and 9B were generated. The advantages of shielding around the test box and the ability to fine tune the location of the tapered-slot antenna in the test box account for some of this difference.

Figure 11:
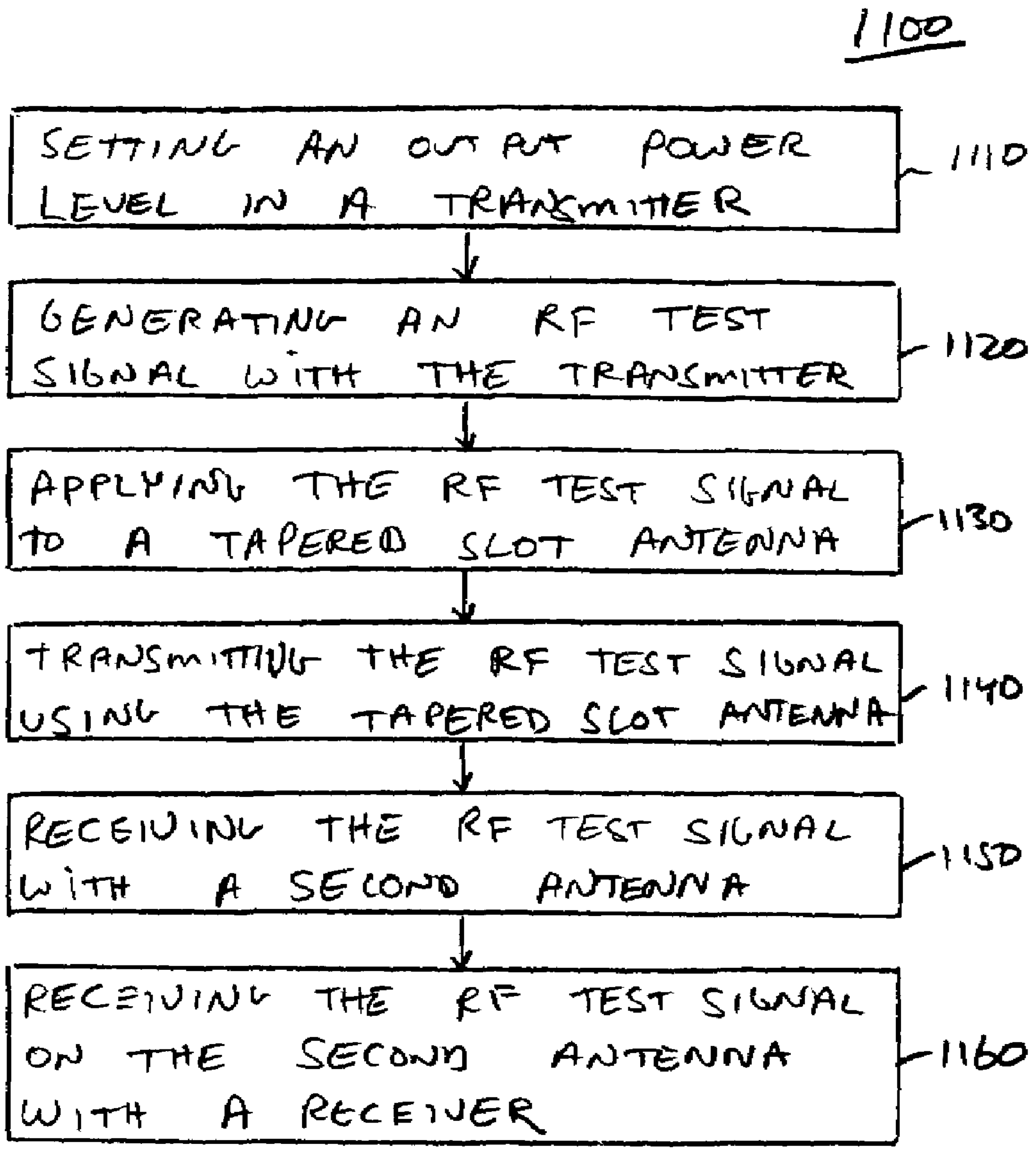
FIG. 11 is a flowchart of a method of testing an RF receiver.

FIG. 11 is a flowchart 1100 of a method of testing a receiver in a wireless phone or other RF device. In act 1110 an output power level in a transmitter is set. The transmitter may be part of a test system or test box. An RF test signal is generated with the transmitter in act 1120, and in act 1130 this RF test signal is applied to a tapered slot antenna. In act 1140, the RF test signal is transmitted using the tapered-slot antenna. The RF test signal is received with a second antenna in act 1150. The second antenna is typically the antenna of the phone or other wireless device under test. In act 1160, the RF test signal on the second antenna is received by a receiver. This receiver is typically a receiver in the phone or other wireless device. By following this method, various test parameters for the receiver may be measured. For example, the receiver's sensitivity may be measured. To do this the RF test signal generated by the transmitter may be reduced in power until the receiver no longer detects an incoming signal. By ensuring that the tapered-slot antenna has a low return loss, the transmitted power is well controlled, and an accurate measurement of the receiver's sensitivity can be made.

Figure 12:
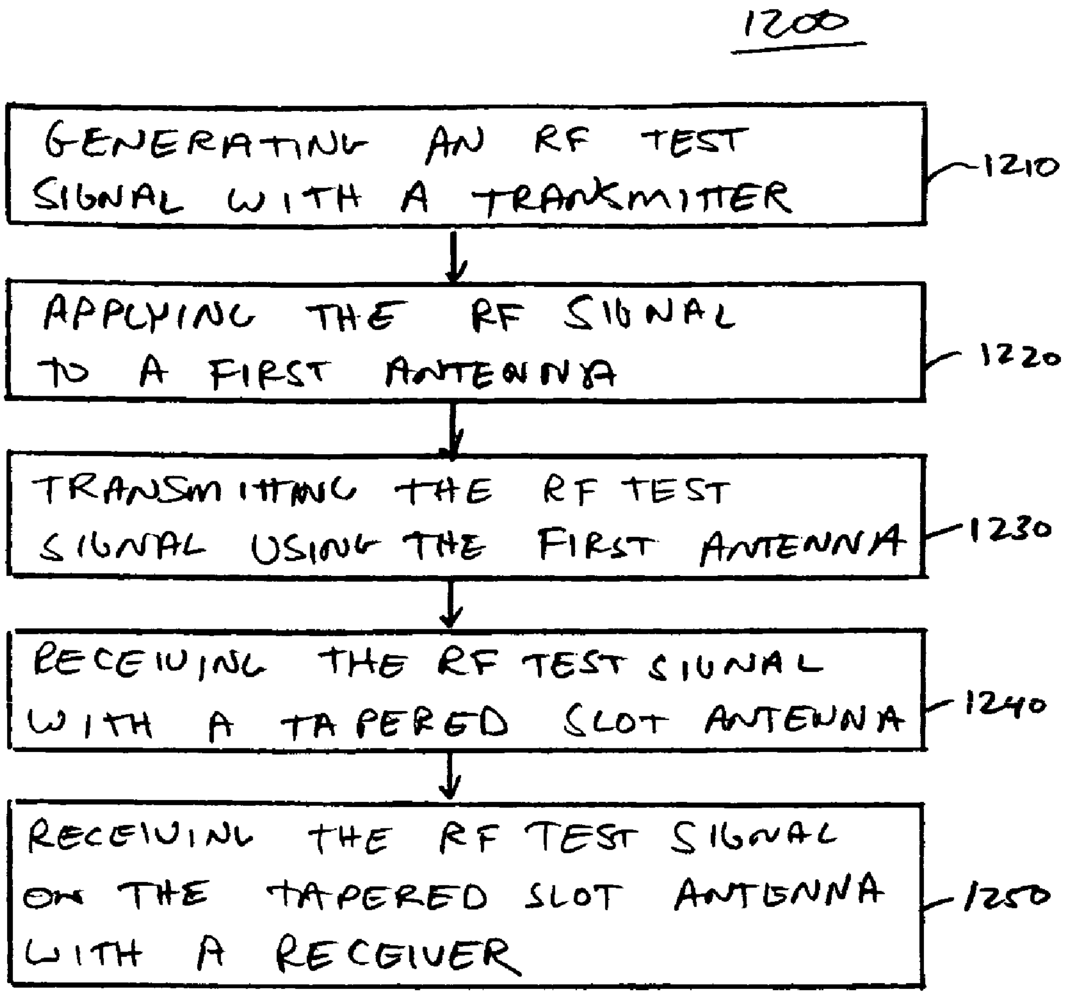
FIG. 12 is a flowchart of a method of testing an RF transmitter.

FIG. 12 is a flowchart 1200 of a method of testing a transmitter in a wireless phone or other RF device. In act 1210, an RF test signal is generated using a transmitter. Typically, this transmitter is in a wireless phone or other RF device under test. In act 1220, the RF signal is applied to a first antenna. In act 1230, the RF test signal is transmitted using the first antenna. The RF test signal is received with a tapered-slot antenna in act 1240. The RF test signal on the tapered-slot antenna is received by a receiver, which is typically part of the test box or test system in act 1250.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the following claims.

What is claimed is:

1. A method of testing mobile phone transmission and reception characteristics over a frequency range including both GSM and DCS frequency bands, the method comprising:

a mounting the mobile phone having a mobile phone antenna in a test fixture proximate to a tapered-slot antenna to provide a test system, the tapered-slot antenna being fixed in the test fixture and adapted to transmit and receive test signals ranging from the GSM frequency band to the DCS frequency band, wherein the tapered-slot antenna is tuned at a center frequency of approximately 1.7 GHz;

transmitting the test signals from the tapered-slot antenna;

receiving the test signals by the mobile phone antenna; and monitoring mobile phone antenna reception characteristics as the mobile phone antenna is rotated on its axis, wherein an insertion loss of the test system is no greater than 1.5 dB over a 100 degree rotation of the mobile phone antenna in the GSM frequency band and no greater than 1.8 dB over a 60 degree rotation of the mobile phone antenna in the DCS frequency band.

2. The method of claim 1, wherein the tapered-slot antenna is an asymmetric tapered-slot antenna.

3. The method of claim 1, wherein the tapered-slot antenna is a wide-band asymmetric tapered-slot antenna.

4. The method of claim 1, wherein the mobile phone antenna is a combined GSM, PCS, and DCS antenna, and the insertion loss of the test system is no greater than 2 dB.

5. The method of claim 1, wherein the mobile phone antenna is a WCDMA antenna, and wherein the insertion loss of the test system is no greater than 2 dB.

6. The method of claim 1, wherein the tapered-slot antenna includes:

a slot surrounded by a first metal piece and a second metal piece;

a connector coupled to the first metal piece and to a conductive shield; and an asymmetric strip line coupling the connector to the slot thereby forming a signal feed port, wherein the test signals to be transmitted by the tapered-slot antenna are applied at the signal feed port and are transmitted at the slot and the test signals to be received by the tapered-slot antenna are received at the slot and provided to the signal feed port.

7. The method of claim 6, wherein the signal feed port has an impedance value selected from a group consisting of 50 ohms, 100 ohms, and 200 ohms.

* * * * *